United States Patent [19]

Samuels

[11] Patent Number: 4,785,137
[45] Date of Patent: Nov. 15, 1988

[54] NOVEL NICKEL/INDIUM/OTHER METAL ALLOY FOR USE IN THE MANUFACTURE OF ELECTRICAL CONTACT AREAS OF ELECTRICAL DEVICES

[75] Inventor: George J. Samuels, Syracuse, N.Y.

[73] Assignee: Allied Corporation, Morris Township, N.J.

[21] Appl. No.: 814,469

[22] Filed: Dec. 30, 1985

Related U.S. Application Data

[63] Continuation-in-part of Ser. No. 605,435, Apr. 30, 1984, abandoned.

[51] Int. Cl.⁴ .................. H05K 5/06; C22C 19/03; C22C 28/00
[52] U.S. Cl. ................. 174/52 FP; 174/68.5; 200/266; 357/72; 357/75; 420/441; 420/456; 420/457; 420/555; 439/887; 428/642; 428/680

[58] Field of Search .............. 420/441, 456, 457, 555, 420/580; 428/642, 680; 200/266; 174/50.54; 357/72, 75

[56] References Cited

U.S. PATENT DOCUMENTS

3,495,972  2/1970  Baum ................................ 420/455
4,572,750  2/1986  Masumoto et al. ............... 420/456

Primary Examiner—L. Dewayne Rutledge
Assistant Examiner—George Wyszomierski
Attorney, Agent, or Firm—Ernest D. Buff; Gerhard H. Fuchs

[57] ABSTRACT

This invention relates to electrical devices in which the electrical contact areas are plated with a nickel/indium-/other metal alloy.

33 Claims, 3 Drawing Sheets

NOVEL NICKEL/INDIUM/OTHER METAL ALLOY FOR USE IN THE MANUFACTURE OF ELECTRICAL CONTACT AREAS OF ELECTRICAL DEVICES

RELATED APPLICATIONS

This application is a continuation-in-part application of application Ser. No. 605,435, filed Apr. 30, 1984, now abandoned.

DISCLOSURE OF THE INVENTION (1) Field of Art

This invention relates to a novel solderable nickel based alloys which are useful in the manufacture of electrical devices. More particularly, this invention relates to a method of using such nickel based alloys in the manfacture of electrical devices in which the alloy is a total or partial replacement for gold in the construction of electrical contact areas. Still another aspect of this invention relates to such electrical devices manufactured in accordance with the method of this invention. Yet another aspect of this invention relates to a new and improved hermetically sealed container for semiconductor and other electronic devices and to a novel sealing cover for use in fabricating the above referenced hermetically sealed container. Other aspects of this invention will become apparent from a purview of the specification and appended claims.

(2) The Prior Art

The electronics industry requires conductors and contacts to carry signals to and from components and components arrays. For many years, gold coatings have been required to assure high reliability in electronics connector applications. For example, in the manufacture of printed circuit boards, the edge contact areas of the board which provide electrical contact between the board and other electrical components in the system are usually coated with a layer of gold or a gold based alloy. Gold or gold alloys are especially useful in these applications because of their low contact resistance, resistance to corrosion, electrical conductivity, resistance to wear and solderability, and because of their inertness to oxidation.

During the last few years, there has been considerable interest in reducing the quantity of gold used on electrical devices for manufacture of electrical contact areas, while at the same time maintaining the same performance characteristics. This interest has been fueled by gold price volatility and by the relatively high cost of gold. Several substitutes for gold have been proposed. For example, the following amongst others, have been proposed as possible alternative electrodeposits to gold on electrical connectors: palladium, palladium/nickel alloys, ruthenium, and tin and tin alloys. Each of these substitutes have a number of disadvantages which limit their suitability as a direct replacement for gold.

While many recently developed palladium coatings demonstrate attractive features for certain applications, the use of palladium or palladium coatings is still approached with hesitation because of problems associated with its use. Among the list of potential problems are high stress and microcracking due to hydrogen outgassing, the formation of a non-conducting and frictional polymer films when palladium mates with itself due to the highly active and catalytic nature of the surface of the palladium electrodeposit, erratic wear characteristics, and less corrosion resistance than gold. In addition, palladium is difficult to electrodeposit in a highly ductile state. Recent advances have attempted to obviate some of the aforementioned difficulties. However, palladium based contacts have still proven to be unacceptable for a large range of applications and when used are usually used in combination with a thin layer of gold.

Some disadvantages associated with the use of ruthenium are that the deposits from all types of electrolytes are highly stressed and unless anode diaphragms are used the electrolytes themselves produce toxic, volatile ruthenium tetroxide at the anode. Suitable ruthenium complex plating salts for producing the metal are also very expensive.

The main disadvantage of tin and tin/lead alloys is that they have very poor wear resistance, are not resistant to oxidation and require relatively high voltages to break down insulating oxide films which form on their surfaces. Moreover, pure tin also has the disadvantage of tending to produce metal "whiskers".

The majority of semiconductor integrated circuit devices are housed in hermetically sealed packages commonly referred to as dual-in-line, flatpack, and hybrid packages. Several designs of such packages are now in use. Among these is one which consists of a ceramic base, a cover, a lead frame, and solder glass for sealing the frame between the base and the cover, known in the trade as the CERDIP (Trademark) package. Another package type consists of a lead frame sandwiched between layers of a glass-ceramic mixture. A cavity is left in one of the layers and the semiconductor device is sealed into the cavity with a metal lid and solder preform. Premolded and transfer-molded plastic packages are also used. One popular type of package is made from a single layer of ceramic having a screened, conductive lead frame pattern deposited on it, the terminal pins on the side of the package being brazed on to give a socalled "side braze" package. This type of package is also made with two layers of ceramic material with the screened conductive pattern sandwiched between the layers and ordinarily sealed with metal lids and metallic solder performs. A number of packages comprising hybrids of those described above are also in use.

An especially effective hermetically sealed container for electronic devices is described and claimed in U.S. Pat. No. 4,105,861. The container of this patent comprises a supporting pad for an electronic device, a conductive lead frame surrounding the pad and forming therewith a unitary construction, and a sheet of homogeneous epoxy resin extending over and fused to each face of the frame and its conductive leads, at least one of the sheets having an aperture dimensioned and disposed to surround the supporting pad and a portion of the adjacent leads of the lead frame. The container further comprises upper and lower cover plates of a material of the group comprising metal, ceramic, glass, and rigid plastic fused to the plastic sheets, one of such plates having an opening in registry with the aperture in the adjacent one of the plastic sheets for receiving an electronic device to be supported on the pad. The container further comprises means for hermetically sealing the opening in such one of the cover plates as for example a gold plated KOVAR® lid with a gold-tin eutectic solder perform.

In an alternative construction, the supporting pad for the electronic device is a portion of the lower cover plate in the form of an upwardly-protruding pedestal and each of the plastic sheets has an aperture dimensioned and disposed to surround such supporting pad and a portion of the adjacent leads of the lead frame, the pedestal extending at least partially through the aperture of the adjacent one of the plastic sheets.

While all of the above-described packages are relative effective, they suffer from some inherent disadvantages. The most pervasive disadvantage is the expense of the container because of the high price of gold, and gold price volatility. For example, the thickness of the gold plating on the KOVAR ® cover lid is specified as a minimum thickness, typically fifty micrometers. Many millions of these lids are produced each year, and the cost of the gold used in plating the lids is several millions of dollars.

SUMMARY OF THE INVENTION

In accordance with this invention there is provided a new and improved nickel based alloy which contains from about 0.1 to about 99 percent by weight nickel; from about 0.1 to about 75 percent by weight indium; and from about 0.1 to about 20 percent by weight of one or more metals selected from the group consisting of gold, osmium, lead, rhodium, ruthenium, copper, silver, rhenium, arsenic, platinum, palladium, tin, cadmium, iridium, gallium, germanium, antimony, zinc and bismuth (all weight percents are based on the total weight of the alloy) which is useful as a total or partial replacement for gold in the manufacture of electrical contact areas of electrical devices. Yet another aspect of this invention relates to electrical devices in which the electrical contact areas are coated with a nickel based alloy of this invention, laminated coatings of one or more of such nickel alloys of varying hardness, a laminated coating of one or more of said alloys and a material comprised preponderantly of a precious metal such as gold, or a gold based alloy, and to a method of manufacturing such devices. As used herein "electrical contact areas" are those areas of electrical devices which are adapted to form mating surfaces to provide electrical continuity between two or more electrical devices.

Still another aspect of this invention relates to an improvement in a hermetic sealing cover for a container for an electronic device of the type which comprises a conductive cover element, the improvement comprises a cover element plated with a nickel based alloy containing from about 0.1 to about 99 percent by weight nickel; from about 0.1 to about 75 percent by weight indium; and from about 0.1 to about 20 percent by weight of one or more metals selected from the group consisting of gold, osmium, lead, rhodium, ruthenium, silver, rhenium, arsenic, platinum, palladium, tin, cadmium, iridium, gallium, germanium, antimony, zinc and bismuth (all weight percents based on the total weight of the alloy); and to an improved hermetically sealed container for electronic devices of the type having a body with a cavity with an opening, means for supporting one or more electronic devices, one or more electronic devices supported by said supporting means, and hermetic sealing means in hermetically sealing engagement with said opening, the improvement comprising hermetic sealing means which comprises a conductive cover element plated with the above-referenced nickel based alloy.

DETAILED DESCRIPTION OF THE INVENTION

This invention relates to novel nikel based alloys and to novel electrical device which has electrical contact areas which mate with similar areas in other electrical devices to provide for electrical continuity between the devices as well as to hermetically sealed containers for semi-conductors and other electronic devices and to a novel sealing cover for use in fabricating the above container. The alloy of this invention has good contact and corrosion resistance as well as good solderability.

As one essential component, the alloy of this invention contains from about 0.1 to about 75 weight percent indium based on the total weight of the alloy. In the preferred embodiments of this invention, the amount of indium in the alloy will vary from about 0.1 to about 25 weight percent indium based on the total weight of the alloy, and in the particularly preferred embodiments may vary from about 1 to about 20 weight percent indium on the same basis. Amongst these particularly preferred embodiments of the invention, alloys containing from about 2 to about 8 weight percent of indium based on the total weight of the alloy are especially preferred for used as the electrical contact areas of electrical devices, and those alloys in which the amount of indium is from about 3 to about 5 weight percent indium by weight of the alloy are most preferred for this application.

As a second essential component, the alloy will contain nickel. The alloy generally will contain from about 0.1 to about 99 weight percent nickel. In the preferred embodiments of the invention, the alloy will contain from about 50 to about 99 weight percent nickel and in the particularly preferred embodiments will contain from about 80 to about 99 weight percent nickel. Amongst these particularlly preferred embodiments, most preferred are those embodiments in which the amount of nickel in the alloy varies from about 90 to about 98 weight percent.

As a third essential ingredient, the alloy of this invention contains one or more metals selected from the group consisting gold, lead, ruthenium, silver, rhodium, rhenium, platinum, palladium, tin, iridium, antimony, copper, zinc, bismuth, gallium, cadmium, osmium, and arsenic. Preferred for use in the practice of this invention are other metals selected from the group consisting of ruthenium, silver, rhodium, palladium, tin, antimony, bismuth, gallium, cadmium and arsenic. Particularly preferred other metals are silver, tin, antimony, bismuth, gallium and cadmium. Amongst these particularly preferred other metals, most preferred for use in the practice of this invention is bismuth.

The amount of the other metal included in the alloy will generally vary from about 0.1 to about 20 weight percent based on the total weight of the alloy. In the preferred embodiments of the invention, the amount of other metal will vary from about 0.1 to about 10 weight percent based on the total, and in the particularly preferred embodiemtns of the invention will vary from about 0.5 to about 5 weight percent on the aforementioned basis. Amongst those particularly preferred embodiments most preferred are those embodiments of the invention in which the amount of other metal in the alloy is from about 1 to about 4 weight percent based on the total weight of the alloy.

The number of layers of alloy employed can vary widely. In the preferred embodiments of the invention, 2 to about 6 layers of alloys are employed, and in the particularly preferred embodiments of the invention, the number of alloy layers may vary from about 2 to about 4. Amongst these particularly preferred embodiments most preferred are those embodiments in which the number of alloy layers is from 2 to about 3.

The hardness of the alloys in various layers can vary widely. In general, the hardness of the alloy in any layer can vary from about 200 to about 800 vickers. In the preferred embodiments of the invention, the hardness of the alloy is from about 300 to about 700 and in the particularly preferred embodiments of the invention, the hardness of the alloy is from about 350 to about 650. Amongst these particularly preferred embodiments most preferred are those embodiments of the invention in which the hardness of the alloy in the various layers is in the range of from about 350 to about 570 vickers.

The hardness of the layers can be controlled using conventional methods known to those of skill in the art. For example, the hardness can be controlled by the addition of various additives to the bath which will be discussed in more detail below or by changes in the current diversity. Those methods are well known in the art and will not be described in great detail.

The order of the layers in terms of their relative hardness can vary widely. For example, in some embodiments of this invention, a bilayer contact material is used. In this embodiment of the invention, the harder material can be the outer contact, i.e., the material which mates with the corresponding contact area of the other device, or the softer material may provide this function. Also, for illustrative purposes, in tri-layer contact materials, the tri-layer structure can consist of a softer alloy sandwiched by two harder alloys, or sandwiched by a harder alloy and softer alloy. Alternatively, the tri-layer structure can consist of a harder alloy sandwiched by two harder alloys, or sandwiched by a harder alloy and a softer alloy. As can be appreciated, the greater the number of layers in the structure, the greater the permissible permutations.

The differences in hardness of the various layers can vary widely. In general, the difference in hardness between adjacent layers may vary from about 20 to about 700 vickers. In the preferred embodiments of the invention, the difference in hardness between adjacent layers is from about 20 to about 600 vickers, and in the particularly preferred embodiments is from about 20 to about 400 vickers. Amongst these particularly preferred embodiments, most preferred are those embodiments in which the difference in hardness between adjacent layers is from about 20 to about 200 vickers.

The nickel/indium alloy for use in the practice of this invention can be prepared by electrodepositing same from a plating bath preferably on to a conducting metal, as for example copper, employing conventional electrodeposition techniques. Useful electrodeposition techniques include both barrel and rack plating procedures. Such conventional electrodeposition techniques which are described in detail in "Electroplating Engineering Handbook" by A. Kenneth Grahams, Ed, Van Nostrand Reinhold Co., NY, N.Y. (1971) are well known in the electroplating art and will not be described herein in any great detail.

In the preferred embodiments of this invention, the alloy is electroplated from the novel bath claimed in my co-pending U.S. patent application Ser. No. 714,849, entitled "Novel Nickel/Indium Alloy and Method of Using Same in the Manufacture of Printed Circuit Boards" filed Mar. 26, 1985. The novel bath of the invention comprises:

(a) at least about 0.5M nickel cations, at least about 0.001M indium cations and at least about 0.0001M other metal cations;

(b) up to about 2.6 M chloride ions;

(c) a buffer material in an amount sufficient to maintain the bath pH of equal to or less than about 5;

(d) an "effective amount of" one or more chelating agents; and (e) water.

In the preferred embodiments of this invention, the concentration of nickel cations, indium cations and the other metal cations in the bath are, respectively, from about 0.5M to about 2.5M, from about 0.001 to about 1M and from about 0.0004 to about 0.5M. In the particularly preferred embodiments of the invention, the concentration of nickel cations, indium cations and other metal cations in the bath are, respectively, from about 0.5M to about 2.0M, from about 0.009M to about 0.1M and from 0.0004 to about 0.2M. Amongst these particularly preferred embodiments, most preferred are those embodiments in which the concentration of nickel cations, indium cations and other metal cations in the bath are, respectively, from about 1M to about 2M, from about 0.015M to about 0.06M, and from about 0.0004 to about 0.015M.

The bath of this invention includes one or more chelating agents capable of chelating indium cations. The types of chelating agents employed in the conduct of this invention can vary widely. For example, useful chelating agents include chelating agents capable of chelating ferric iron ($Fe^{3+}$). Illustrative of such chelating agents are those described in Ramunas J. Matekaitis and Arthur E. Martell, *Inorganic Chemistry*, 1980, 19, pp.1646–1651; Wesley R. Harris and Arthur E. Martell, *Inorganic Chemistry*, 15, 713 (1976); and Martell, A. E. and Smith, R. M., "Critical Stability Constants", Fe(III) and include the following compounds: adipyl, suberyl, sebacyl, dodecanedioyl, gluconic acid, saccharic acid, glyceric acid, bicine, catechol, iminodiacetic acid, nitrilotriacetic acid, ((hydroxyethyl)imino) diacetic acid, cyclohexanediamine tetraacetic acid, diethylenetriaminepentaacetic acid, salicyclic acid, chromotropic acid, hydroxamic acid, N,N'-bis(O-hydroxybenzyl)e- thylenediamine-N,N'-diacetic acid, ethylene-1,2-bis(O-hydroxy)phenylglycine, N-hydroxybenzyliminodiacetic acid, N-hydroxyethylethylenediamine-N,N',N,N',N'-triacetic acid, N,N'-ethylenediaminediacetic acid, N,N-ethylenediaminediacetic acid, N,N-bis(2-aminoethyl)glycine, N,N'-diglycylethylenediamine-N'',N''-tetraacetic acid, N-hydroxyethyliminodiacetic acid, N-(2-hydroxy-5-sulfobenzyl)ethylenediamine-N,N'-bis(methylenephosphoric) acid, triethylene tetramine hexaacetic acid, tetraethylene pentamine heptaacetic acid, ethylenediamine-N,N'-diacetic-N-N'-bis(-methylene-phosphonic) acid, glycine-N,N'-bis(methylene phosphonic) acid, ethylenediamine-N,N'-bis(-methylene phosphonic) acid, 1-hydroxythane-1,1-disphosphonic acid, (2-hydroxybenzyl)imino bis-(methylene phosphonic) acid, ethylenediamine-N,N,N',N'-tetrakis(methylene phosphonic) acid, and N-(phosphonomethyl)iminodiacetic acid. Other useful chelating agents for use in the practice of this invention include carboxylic acids having one or more carboxy functions ("carboxylic acids"), carboxylic acids having one or more carboxy functions and one or more hydroxy functions ("hydroxycarboxylic acids") and carboxylic acid functions having one or more amino functions and one or more carboxy functions ("aminocarboxylic acids") and salts thereof. Illustrative of such materials are: citric acid, malonic acid, tartaric acid, adipic acid, phthalic acid, oxalic acid, glutaric acid, isophthalic acid, maleic acid, fumaric acid, succinic acid, glycolic acid, glyoxylic acid, glutamic acid, glyceric acid, malic acid, lactic acid, hydroxybutyric acid, mandelic acid, valine, arginine, aspartic acid, pyruric acid, glutamine, leucine, lysine, threonine, isoleucine, valine and asparagin. The chelating agents can be used alone, or combinations of chelating agents can be employed. For example, varying amounts of a relatively strong chelating agent such as ethylene diamine tetraacetic acid can be used in combination with varying amounts of one or more relatively weak chelating agents such as malonic acid, citric acid, malic acid and tartaric acid to control the amount of "electroactive indium", that is, the amount of indium which is available for electroplating.

Preferred chelating agents for use in the practice of this invention are relatively weak chelating agents such as carboxylic acids, as for example malonic acid and tartaric acid; hydroxycarboxylic acids, as for example citric acid and malic acid, and salts of such acids. Hydroxycarboxylic acids and their salts are particularly preferred for use, and citric acid, malic acids and their salts are most preferred.

The use of the chelating agent is believed critical for the electrodeposition of nickel/indium alloy having acceptable properties, and also for control over the amount of indium in the alloy and the variance of such amount as a function of the effective current density. While we do not wish to be bound by any theory, it is believed that proper selection of a chelating agent or combination of more than one chelating agents can effectively control the amount of indium species available for plating at relatively constant value over a relatively broad operating time. Thus, the use of such chelating agents provides for a means of control of the percentage of indium in the plate.

An "effective amount" of one or more chelating agents is included in the bath. As used herein, "an effective amount" of chelating agent is an amount which is effective for control of the amount of electroactive indium to any extent. The amount of the chelating agent can vary widely depending on a number of factors, including the type of chelating agent employed, the amount of electroactive indium desired, the desired concentration of indium in the plate, current density, the pH, etc. In general, the amount of chelating agent is at least about 0.001M. In the preferred embodiments of the invention, the amount of chelating agent is from about 0.001M to about 2.6M, and in the particularly preferred embodiments, is from about 0.005M to about 1.6M. Amongst these particularly preferred embodiments of the invention, most preferred are those embodiments in which the amount of chelating agent in the bath is from about 0.05M to about 0.25M.

The nickel, indium and other metal cations for use in the plating bath used in this invention can be derived from any source. In general, these cations are derived from water soluble slats of the metals. In the preferred embodiments of the invention, the nickel, indium and other metal cations are derived from nickel, other metal and/or indium chloride, nickel or indium carbonate, water-soluble nickel and/or indium salts of sulfamic acid, and sulfuric acid, as well as hydroxycarboxylic acids, aminocarboxylic acids, which do not contain mercapto functions, and like nickel, other metal and/or indium salts of acids which can also function as chelators. Illustrative of useful water-soluble nickel, other metal and indium salts are the nickel, other metal and indium salts of citric acid, acetoacetic acid, glyoxylic acid, pyruric acid, glycolic acid, malonic acid, hydroxamic acid, iminodiacetic acid, salicylic acid, glyceric acid, succinic acid, malic acid, tartaric acid, hydroxybutyric acid, arginine, aspartic acid, asparagine, glutamic acid, glycine, glutamine, leucine, lysine, threonine, isoleucine, valine, and the like. In the preferred embodiments of the invention, the nickel, other metal and indium salts of sulfamic acid and sulfuric acid acid are employed as the source of nickel, other metal and indium cations, and in the particularly preferred embodiments of the invention, nickel and indium salts of sulfamic acid are used as the sources of nickel, other metal and indium cations.

The concentration of chloride ions in the bath is from 0 to about 2.6M. The chloride ions may be obtained from any metal salt which will not electrodeposit under the operational conditions of the bath or from nickel and/or indium salts. Illustrative of such useful metal salts are sodium and potassium chloride, non-metal salts such as ammonium chloride, nickel or indium chloride and the like. The chloride ions are preferably derived form indium and/or nickel chloride, with nickel chloride being a particularly preferred source of chloride ions. In the preferred embodiments of the invention, the concentration of chloride ions in the bath is from about 0.001M to about 2.6M, and in the particularly preferred embodiments, the concentration of chloride ions in the bath is from about 0.005M to about 1.6M. Amongst these particularly preferred embodiments, most preferred are those embodiments in which the concentration of chloride ions in the bath is from about 0.05M to about 0.25M.

The plating bath of this invention usually has a pH equal to or less than about 5, preferably from about 1.4 to about 5.0, most preferably from about 2.3 to about 3.6. The pH of the plating bath can be maintained at the desired pH by the use of buffer materials. The type of buffer material used can vary widely, depending on the desired pH. For example, the pH can be maintained within the preferred pH range through use of such materials as boric acid, or can be adjusted by addition of basic materials, such as ammonium hydroxide, nickel sodium hydroxide, triethylamine, triethanolcarbonate, carbonate, sodium hydroxide, triethylamine, triethanolamine, pyridine, sodium carbonate, and the like. The pH can also be adjusted through use of sulfonic acid or the hydroxy carboxylic acid, when a carboxylic acid or its salt is the chelating agent. The particular pH employed the particularly preferred embodiments of the invention will depend on the particular buffer material used. For example, where a hydroxy carboxylic acid, such as citric acid, is the buffer material and chelating agent of choice, sufficient material is used to maintain the pH from about 1.4 to about 4.7, and preferably from about 1.8 to about 3.8. In the particularly preferred embodiments of the invention where a hydroxy carboxylic acid is used as the buffer material and chelating agent, the pH may vary from about 2.0 to about 2.8, and in the most preferred embodiments of the invention where a hydroxy carboxylic acid is used as the buffer material and chelating agent, the pH may vary from about 2.1 to about 2.7. On the other hand, experimentation has shown that best results are obtained when boric acid is the buffer material of choice if the pH is maintained in the range of from about 1.5 to about 3.5. In the preferred embodiments of the invention where boric acid is the buffer material of choice, the pH may vary from about 2.0 to about 3.0, and in the particularly preferred embodiments the pH may vary from about 2.5 to about 3.0. In the most preferred embodiments of the invention in which boric acid is the buffer material of choice, the pH can vary from about 2.8 to about 3.0.

The bath of this invention may include other optional ingredients which are normally used with or incorporated into plating baths. For example, the plating bath of this invention may include one or more compounds to reduce surface pitting, such as alkyl sulfonic acid salts and the like. Other optional materials which may be included in the bath of this invention are dextrose type stabilizers for indium. Additionally other alloy modifying agents, such as saccharin and counarin which affect the alloy characteristics such as internal stress and appearance of the alloy electroplated can also be included in the bath.

During electrodeposition procedure, the plating bath is normally maintained at a temperature of from about 10° C. to about 80° C. In the preferred embodiments of the invention, the electrodeposition temperature is from about 20° C. to about 65° C., and in the particularly preferred embodiments of the invention the electrodeposition temperature is from about 35° C. to about 65° C. Amongst the particularly preferred embodiments of the invention, most preferred are those embodiments in which the electrodeposition temperature is from about 35° C. to about 55° C.

In the electrodeposition procedure, current densities can vary widely depending on whether panel or barrel plating techniques are employed. However, in most embodiments of the invention where panel plating techniques are employed, the current density is usually maintained within the range of from about 1 to about 200 milliamperes per $cm^2$. In the preferred embodiments of the invention where panel plating techniques are employed, the current density is from about 5 to about 100 milliamperes per $cm^2$, and in the particularly preferred embodiments is from about 10 to about 60 milliamperes per $cm^2$. Amongst these particularly preferred embodiments where panel plating techniques are employed, most preferred are those embodiments in which the current density varies from about 20 to about 40 milliamperes per $cm^2$. When barrel plating techniques are employed, typical applied current densities are from about 2 to about 10 times less than the current densities used in panel plating.

In the most preferred embodiments of the invention using barrel plating techniques, the current density employed will vary depending on whether the contact area being electroplated is on an inside surface, i.e., female type contact, or on an outside surface, i.e., male type contact. In these most preferred embodiments, current densities used for plating male type contact areas will vary from about 3.2 to about 5.9 $mA/cm^2$, and for plating female type contact areas will vary from about 6.45 to about 9.7 $mA/cm^2$.

The electrodeposition process is carried out for a period of time sufficient to electrodeposit the desired amount of the nickel/indium alloy. As will be apparent to one of skill in the relevant art, electrodeposition times may vary widely depending on a number of factors, including but not limited to desired thickness of the electrodeposit, current density, bath temperature, plating techniques and other factors known to those skilled in the art. Typical plating times vary from a few minutes to several hours.

Broadly stated, the novel nickel/indium alloy is as a total or partial replacement for gold and gold based alloys in electrical devices where gold is now used as the electrical contacting surface. The alloy is especially useful in this application because of its superior contact and corrosion resistance. For example, the novel alloy of this invention can be used in the manufacture of electrical contact areas of electrical interconnecting devices, as for example connector pins and the like. These electrical devices are well known in the art and will not be described herein in great detail. Moreover the nickel/indium alloy can be used in the manufacture of electrical contact areas of switches as a partial or total replacement for gold in these devices, as well as in the construction of the electrical circuitry of such devices.

The nickel/indium alloy is particularly useful in the method of this invention for the construction of the electrical contact areas of printed circuit boards, switches, electrical connectors, chip carriers and the like. For example, the nickel/indium alloy can be used in the manufacture of the electrical contact areas of printed circuit boards manufactured by the subtractive, additive and semi-additive processes. The general technique of forming printed circuit boards by means of the subtractive, additive and semi-additive processes are very well known in the art and will not be described herein in any great detail. Examples of the subtractive, additive, and semi-additive processes are described in detail in U.S. Pat. Nos. 3,673,680; 4,135,988; 3,930,963; 3,625,758; 3,956,041; 3,854,973; 3,694,250; 3,628,999; 3,874,897; 3,960, 573; 3,635,758; 3,615,736; 3,865,623; and 4,217,182.

The following specific examples are presented to more particularly describe the invention.

EXAMPLE I

General Procedure

The nickel/indium/bismuth sulfate and inckel/indium/bismuth sulfamate plating baths were prepared similarly. Preparation of one liter of the sulfate and sulfamate formulations is outlined below. Citric acid (57 grams) is dissolved in 300 ml of deionized water heated to 45° C. Nickel carbonate (45 grams) is then dissolved in the solution. The pH of the bath at this point should be about 4.0. Nickel chloride (15 or 75 grams/liter of nickel chloride hexahydrate for the sulfate and sulfamate plating baths, respectively) and nickel sulfate (300 grams/liter of nickel sulfate hexahydrate or 350 grams/liter of nickel sulfamate hexahydrate) are then added. The solution is brought up to a volume of 1L by addition of deionized water and the pH of the bath is adjusted to 3.2 either with nickel carbonate or sulfuric/sulfamic acid. Indium metal is then added electrochemically. Indium metal (either strips or shot in an anode basket) is dissolved anodically at about 5 amps/dm$^2$. The cathode current density should be greater than about 50 amps/dm$^2$. Current is applied until the indium reaches the desired concentration, e.g. 2.5 grams/liter for the sulfate formulation and 5 grams/liter for the sulfamate bath. Bismuth in solution form is then added. Bismuth is added as an HCl solution prepared by dissolving sodium bismuthate in 20% HCl, precipitating a white solid by the addition of water, filtering and redissolving the solid in 20% HCl. The bismuth concentration is varied from 0.1–3.0 g/L metal in the sulfate system and from 0.2–2.0 g/L metal in the sulfamate system. The base formulation for the sulfate based Ni/In/Bismuth alloy electroplating bath is set forth the following Table I.

TABLE I

| Component and Parmeters | Amount (g/L) |
| --- | --- |
| Nickel Sulfate Hexahydrate | 300 |
| Nickel Chloride Hexahydrate | 75 |
| Nickel Carbonate | 45 |
| Citric Acid Monohydrate | 57 |
| Indium Metal | 2.5 |
| Bismuth | 0.1 |
| Temperature | 35–55° C. |

The base formation for the sulfamate based Ni/In/Bismuth alloy electroplating bath is set forth in the following Table II.

TABLE II

| Component | Amount (g/L) |
| --- | --- |
| Nickel Sulfamate Hexahydrate | 350 |
| Nickel Chloride Hexahydrate | 15 |
| Citric Acid Monohydrate | 57 |
| Base to pH 3.2 NH$_4$ or Nickel Carbonate | |
| Indium Metal | 5.0 |
| Bismuth | 0.3 |
| Temperature | 35–55% |

Composition of ternary Ni/In/Bi alloys at three current densities electrolplated from both the sulfate and sulfamate bath at a temperature of from 35°–55° C. are described in the following Table III.

TABLE III

| ALLOY | CURRENT DENSITY (ASF) | METAL | % metal (SULFATE) | % metal (SULFAMATE) |
| --- | --- | --- | --- | --- |
| I | 3 | Ni | 6.1 | |
| | | In | 75.3 | |
| | | Bi | 18.6 | |
| II | 14 | Ni | 56.5 | |
| | | In | 37.4 | |
| | | Bi | 6.2 | |
| III | 35 | Ni | 98.7 | |
| | | In | 1.3 | |
| | | Bi | Trace | |
| IV | 3 | Ni | — | 6.5 |
| | | In | — | 84.4 |
| | | Bi | — | 9.1 |
| V | 14 | Ni | — | 95 |
| | | In | — | 3.5 |
| | | Bi | — | 1.7 |
| VI | 35 | Ni | — | 97 |
| | | In | — | 1.1 |
| | | Bi | — | 1.9 |

EXAMPLE II

Several carried out to determine the relative solderablity of several nickel/indium/bismuth alloys of this invention, and several nickel/indium and nickel/bismuth alloys. The nickel/indium and nickel/bismuth alloys were prepared vary modifications of the baths of Tables I and II. Basically, the nickel/indium sulfate and sulfamate baths were identical to those of Tables I and II, except that bismuth was omitted, and the nickel/bismuth sulfate bath was identical to that of Table II, except that indium was omitted. The composition of the binary Ni/In and Ni/Bi alloys at various current densities are set forth in the following Table III.

TABLE III

| Alloy | Approximate Current Density | % Metal Sulfate | % Metal Sulfamate |
| --- | --- | --- | --- |
| Comp I | 31.5 | Ni | — |
| | | In | — |
| Comp II | 6.5 | Ni | — |
| | | In | — |
| Comp III | 15 | Ni | — |
| | | In | — |
| Comp IV | 30 | Ni | — |
| | | In | — |
| Comp V | 1.5 | Ni | — |
| | | In | — |
| Comp VI | 6.5 | Ni | — |
| | | In | — |
| Comp VII | 15 | Ni | — |
| | | In | — |
| Comp VIII | 30 | Ni | — |
| | | In | — |
| Comp IX | 1.5 | Ni | — |
| | | Bi | — |
| Comp X | 6.5 | Ni | — |
| | | Bi | — |
| Comp XI | 15 | Ni | — |
| | | Bi | — |
| Comp XII | 30 | Ni | — |
| | | Bi | — |

The solderability test procedure used is as follows. Plated samples are cut into coupons. The coupons are degreased and dipped into flux and allowed to stand for one minute. The samples are dipped into 60/40 tin/lead solder at 230°±-5° C. at the rate of 1in/min and held in the solder for 5–7 secs. The samples are then examined visually for their solderability.

The results of the test are set forth in the following Table IV. In Table IV, the solderability of the alloys is rated as follows:
A=Excellent Solderability
B=Very Good
C=Good Solderability
D=Fair Solderability

TABLE III

Dip Soldering Test of
Hull Cell Plates Containing Bismuth

| Alloy No. | Solderability |
| --- | --- |
| Comp I | A |
| Comp II | A |
| Comp III | A |
| Comp IV | A |
| Comp V | A |
| Comp VI | B |
| Comp I | D |
| Comp II | D |
| Comp III | D |
| Comp IV | C |
| Comp V | D |
| Comp VI | D |
| Comp VII | D |
| Comp VIII | D |
| Comp IX | B |
| Comp X | B |
| Comp XI | B |
| Comp XII | B |

EXAMPLE III

Referring now to the drawings, FIGS. 1–10 illustrate the sequence of the process steps in accordance with a preferred embodiment of this present invention for use of the nickel/indium/other metal alloy of the invention in the manufacture of printed circuit boards beginning with the basic process material and ending with the finished product, which is a double-sided printed circuit board with copper circuits, plated through-holes and optionally of gold edge contact areas in which the nickel/indium/other metal alloy of this invention is a total or partial replacement for gold.

Figure 1:
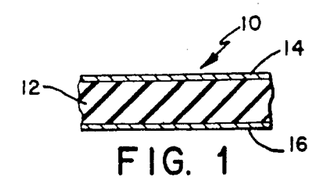
FIGS. 1 to 10 are a series of fragmentary sectional views corresponding to successive process steps in the preparation of a printed circuit board with plated through holes in which a nickel based alloy of this invention has totally or partially replaced gold.

The basic starting material is shown in FIG. 1 and consists of a commercially available laminated board Board 10 consists of substrate 12 composed of an electrically non-conductive material as for example fiberglass reinforced epoxy resin or a thermo-plastic material. Substrate 12 is laminated with an extremely thin copper clad or film 14 and 16 on opposite sides thereof. Copper film 14 and 16 have a thickness of about 0.00356 cm while the substrate has a thickness of approximately about 0.157 cm.

Figure 2:
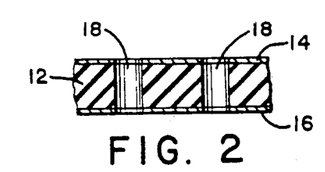

Holes or apertures 18 are formed through laminated board 10 at predetermined locations where plated through-holes are required. Holes 18 are illustrated in FIG. 2 and may be formed, for example, by drilling by a tape controlled drilling machine. Board 10 may be supported during the drilling process by either aluminum of a paper phenolic entry and exit material. After drilling, board 10 is cleaned.

It is desirable, initially, to sensitize the whole of board 10 and the exposed surfaces of substrate 12 at drilled holes 18. This may be effected by dipping board 10 in a suitable catalyst, such as palladium tin chloride.

Figure 3:
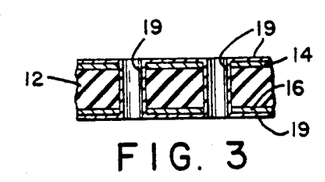

Subsequently, a thin film or layer of copper 19 is plated over board 10 by conventional electroless plating means. This may, for example, be effected by electroless copper plating to provide a film approximately 0.000254 cm thick. Layer 19 also covers the surfaces of the holes 18, as shown in FIG. 3. Preferably, however, a dry film photoresist is applied, and subsequently exposed and developed. To this end board 10 is initially cleaned. This may be effected by a sander or by a brush having fiber bristles and pumice. Subsequently, board 10 may receive a deionized or distilled water rinse, and may be dried by filtered compressed air.

A dry film photoresist layer 20 and 22 is applied to opposite surfaces of board 10. Illustrative of suitable photoresist materials are DuPont Riston 218R ®. The photoresist layers may be applied by passing the resist and board through a laminator. This may be effected at a temperature between 104.5° C. and 124° C., depending upon the type of laminator utilized. The thickness of the photoresist layers 20 and 22 is determined by the desired thickness of the plated circuit. Normally, photoresist layers 20 and 22 are somewhat thicker, may be about 0.000762 cm than the desired thickness of the plated circuit. By way of example, to achieve a plated circuit of approximately 0.00381 cm thickness, photoresist layers 20 and 22 should have a thickness of about 0.00457 cm.

Figure 4:
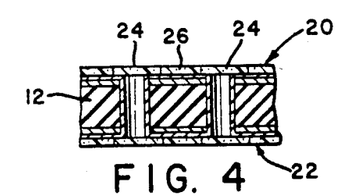

Thus-applied or laminated photoresist layers 20 and 22 are then photographically exposed through a suitable mask. Subsequently, photoresist layers 20 and 22 are developed. This will remove non-polymerized areas 24 which are susceptible to the developer. Areas 24 on photoresist layers 20 and 22 correspond to the areas of the circuits to be plated and to the surfaces of holes 18. Photoresist layers 20 and 22 then have polymerized areas 26 which are resistant to the etchant and which cover all other areas of photoresist layers 20 and 22 as shown in FIG. 4. Photoresist layers 20 and 22 may be exposed by a light source in a vacuum of 77.97 kPa or more for a time of approximately one and one-quarter minutes. Following exposure, the vacuum is released and layers 20 and 22 normalized at room temperaphotoresist ture for at least 30 minutes. Then photoresist layers 20 and 22 may be developed in a suitable processor.

Figure 5:
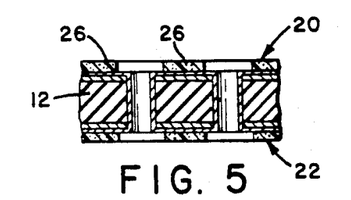
Figure 6:
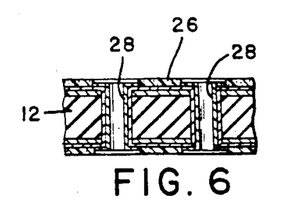

FIG. 5 illustrates board 10 after non-polymerized areas 24, which are susceptible to the developer, have been removed. This may, for example, be effected by immersion in a suitable developing solution which exposes holes or apertures 18 and the desired circuit images on both sides of the board.

Figure 7:
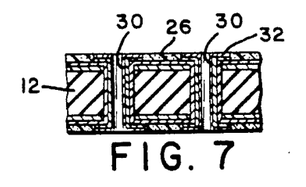
Figure 8:
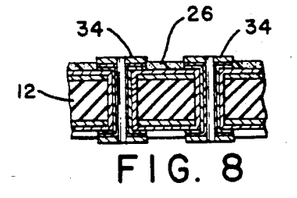

Board 10 is then electroplated with copper, pattern plating, so as to provide a required thickness of copper in the circuit image and on the inside surfaces of the drilled holes, all in the conventional manner. For example, photophosphate process may be used to achieve a minimum copper plating 30 (see FIG. 7) of 0.00254 cm over the surfaces of holes 18 and copper circuit 32 of approximately 0.00381 cm. The circuit plating 32 is contained within the boundary of the walls of polymerized photoresist 26 as shown in FIG. 7.

After the electro-copper plating step and on removal from the electroplating pattern plating bath, board 10 is washed with water in a dragout bath, water rinsed, subjected to an anti-tarnish treatment, e.g. in IMASA Cu-56 (Trade Mark) for about 1 to 2 minutes at about 20° to 25° C., water rinsed and dried. Exposed copper layers 30 and 32 are then cleaned for about 2 minutes in a micro-etch acid cleaner at about 20°-25° C., board 10 is rinsed in water for about 1 minute and in deionized water for about 25 minutes. The exposed copper layers 30 and 32 are then electroplated with a suitable metallic etch resist, as for example a tin/lead solder or a nickel/indium alloy containing from about 0.3 to about 10 weight percent indium based on the total weight of the alloy and preferably from about 1 to about 3 weight percent indium on the aforementioned basis whose manufacture and use are described in detail in my copending U.S. patent application Ser. No. 605,352, entitled "Novel Nickel/Indium Alloy and Method of Using Same in the Manufacture of Printed Circuit Boardsp", filed Apr. 30, 1984.

Figure 9:
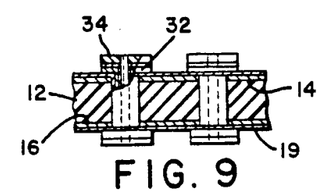

On removal from the electroplating bath, board 10 is washed with water in a dragout bath for about 10 seconds and then in a hot water bath for about 1 minute, rinsed in water and dried. Photoresist 26 is then removed by immersing board 10 in a first bath of alkaline solvent stripper, e.g., Robertsons EP-118, for about 10 minutes at about 60°–70° C., in a second bath of alkaline solvent stripper for about 5 minutes at about 60°–70° C. and passing board 10 through a hot alkaline solvent stripping brush machine at about 50° C. as shown in FIG. 9. Board 10 is then etched in conventional manner using an ammoniacal etchant, e.g., MacDermid 9151, at about 45° C. to remove copper from the areas of board 10 not covered by the nickel/indium etch resist care being taken to maintain the etchant within its normal operating limits and to avoid over-etching which can result in the edges of copper layers 30 and 32 becoming undercut to such an extent that slivers of the nickel/indium alloy, which acts as an etch resist during etching, can break off and contaminate the printed circuit. After etching, board 10 is rinsed in water, dried and masked for plating of the edge contact area only.

The nickel/indium/other metal alloys have electrical properties similar to that of gold. Thus the edge electrical 33 contacts can be provided either by simply plating copper layer 30 and 32 in the edge electrical contact 33 with nickel/indium/other metal alloy to a required thickness thereby forming the electrical contact 33 to totally replace gold. Alternatively, the edge electrical contacts 33 can be provided by first plating copper layers 30 and 32 in the edge contact area with a nickel/indium/other metal alloy to increase the thickness thereof on the layer 30 and 32 in the edge contact electrical area 33 and then plating with gold.

To prepare copper layers 30 and 32 in the edge contact area 33 for electroplating either with the nickel/indium/other metal alloy or with gold, layers 30 and 32 are given a light chalk clean or hot alkaline clean, rinsed in 10% HCL for 25 seconds to remove chalk residues. Board 10 is then rinsed in water, and treated with 50% HCL for 1–1.25 minutes to reactivate the nickel in the nickel/indium/other metal alloy previously deposited on layer 30 and 32. The activated board 10 is rinsed in water for 1 minute and rinsed in deionized water for 25 seconds. If layers 30 and 32 in the edge contact area are to be first electroplated with the nickel/indium/other metal alloy, and hhen with gold the above preparation is carried out both before plating with the nickel/indium/other metal alloy and before plating with gold.

The electrical contact area 33 is electroplated with a nickel/indium/other metal alloy generally containing from about 99 to about 55 weight percent nickel from about 0.1 to about 75 weight percent indium and from about 0.1 to about 20 weight percent of the other metal, wherein all weight percents are based on the total weight of the alloy. In the preferred embodiments of the invention the alloy electroplated over the electrical contact area 33 contains from 99 to about 80 weight percent nickel and from about 0.1 to about 37 weight percentindium and from about 0.1 to about 10 weight percent of the other metal on the aforementioned basis. In the particularly preferred embodiments of the invention, the alloy contains from about 97.5 to about 90% weight percent nickel, from about 2 to about 10 weight percent indium and about 0.5 to about 5 weight percent of the other metal on the aforementioned basis. The nickel/indium/other metal alloy can be electroplated on to electrical contact area 33 using conventional plating procedures. The plating bath used and operational parameters are as set forth in the following Table V.

TABLE V

| Component or Parameter | Amount (g) L or Value |
| --- | --- |
| (a) Nickel Sulfate Hexahydrate | 300 |
| (b) Nickel Carbonate | 45 |
| (c) Nickel Chloride | 75 |
| (d) Indium Metal | 2.5 |
| (e) Citric Acid Monohydrate | 57 |
| (f) Other Metal | 0.1–3.0 |
| (g) Temperature | 50° C. |
| (h) Current density | 3 mA/cm$^2$–35 mA/cm$^2$ |
| (i) pH | ~3.2 |

*Current density will depend on the shape of the part being plated.

The plating is carried out for a period of time sufficient to build up desired thickness of nickel/indium/other metal alloy in the layers 30 and 32 in the edge contact area. In the preferred embodiments, where the nickel/indium/other metal alloy is used as a total replacement for gold, the thickness of the alloy is at least about 1 micron, and in the particularly preferred embodiments where total replacement of gold is desired is at least about 2.5 microns. In the preferred embodiments of the invention where the nickel/indium/other metal alloy of this invention is a partial replacement for gold the thickness of the alloy deposited is at least about 0.5 microns and in the particularly preferred embodiments is at least about 1.8 where partial replacement of gold is desired.

To gold plate nickel/indium/other metal alloy coated copper layers 30 and 32 in the edge contact area, board 10 is loaded into the plating bath, and electroplating is carried out at a current density of about 10 A/cm$^2$ (10 ASF), and a temperature of about 35° C. for a period of time (usually about 5 minutes) sufficient to build up the required thickness of gold, e.g., from about 0.25 to about 2.5 microns, and preferably from about 1 to about 1.3 microns, on nickel/indium/other metal alloy coated copper layers 30 and 32 in the edge contact area.

By the use of the method of the present invention the steps of masking the printed circuit, stripping the tin/lead from the edge contact area, removing the masking and applying a new mask, and reflowing the tin/lead all of which steps are essential in the conventional method when producing a printed circuit with gold plated edge contacts, can be completely avoided with consequent savings in both time and energy. Also, because the gold is either totally replaced by or is plated directly onto the nickel/indium/other metal alloy the difficulties associated with obtaining a good joint between the gold and the adjacent tin/lead alloy which are experienced in known methods are avoided. Moreover, nickel/indium/other metal alloys have a bright shiny appearance when electroplated onto the electrically conductive material in layers 30 and 32 and do not soften and run at normal soldering temperatures so that a completed printed circuit with components soldered thereon is more aesthetically pleasing in appearance than a conventionally produced printed circuit using tin/lead alloy and less likely to short circuit. In addition, no gold or less gold can be used in the edge contact area of a printed circuit with edge contacts, thus providing savings in precious metal.

Figure 10:
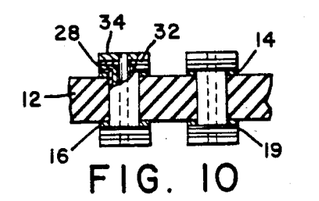

The finished plated through-hole printed circuit board is illustrated in FIG. 10 which can be used as a conventionally produced printed circuit board, e.g. it can have a solder mask applied thereto and components mounted thereon by a flow soldering technique.

EXAMPLE IV

Figure 11:
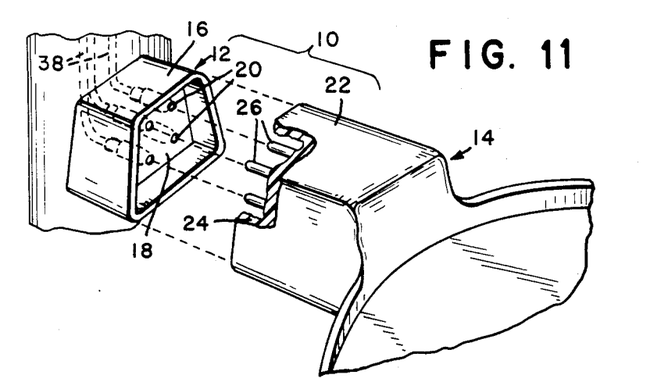
FIG. 11 is a perspective, exploded view of a device incorporating a connector embodying the features of the present invention.
Figure 12:
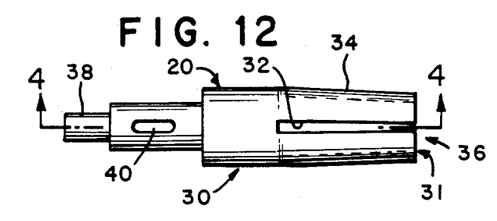
FIG. 12 is a large scale, side elevational, view of a socket contact and connected conductor, included in the left hand portion of FIG. 11.

Referring in detail to the accompanying drawings, attention is directed first to FIG. 11 showing one of a wide variety of instrumentalities in which the connector member is electroplated with the nickel based alloy of the present invention can be incorporated. In FIG. 11 an instrumentality is indicated generally at 10 which includes two main components 12 and 14 adapted for connection together, both mechanically and electrically. Component 12 includes a mounting element 16 having a socket element 18 which includes a plurality of socket contacts 20. Component 14 includes a mounting member or component 22 that can be telescoped over element 16 for mechanically mounting component 14 on component 12.

Component 14 includes plug element 24 including pin contacts having pins 26 insertable into sockets 20 when components 12 and 14 are fitted together, for establishing electrical contact engagement between the electrical elements of the two components. Such an interconnected relation is illustrated in FIG. 14.

Figure 14:
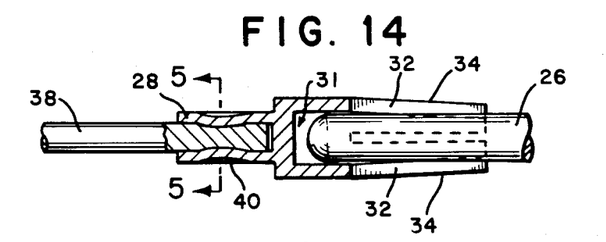
FIG. 14 is an axial sectional view taken at line 4—4 of FIG. 12, and including the pin of a pin contact inserted in the socket of the socket contact.
Figure 15:
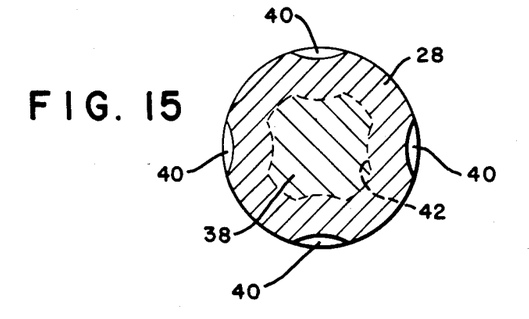
FIG. 15 is a large scale sectional view taken at line 5—5 of FIG. 14.

As can be appreciated from FIGS. 14 and 15, pins 26 consist of a core 26(a) composed of berylium copper coated with layers 26(b) and 26(c) composed of nickel/indium alloys. Layer 26(b) is bonded directly to core 26(a), and consist of the nickel/indium/other metal alloy of this invention. Layer 26(c) is also composed of nickel/indium/other metal alloy of this invention and has a thickness of 0.6 to 5M, preferably of 1.8M.

Figure 13:
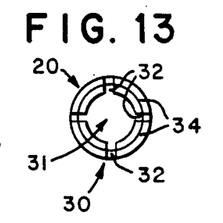
FIG. 13 is an end view taken from the right of FIG. 12.

The socket contact 20 is an integral piece, of berylium copper and which may be formed in any suitable manner, such as for example as by being machined. The contact socket as disclosed herein includes a crimp pocket or barrel 28 and a tined area 30, both tubular, the latter being slotted at 32 to form a plurality of (preferably four) tines or brushes 34, which are bent or formed inwardly at open end 36 of the socket 31. As is apparent from FIGS. 13 and 15, the interior surface of tined area 30 is coated with a layer 30(a) and 30(b) composed of nickel/indium/other metal alloy.

Crimp pocket 28 is adapted for receiving a conductor wire 38 which preferably in installations in which the present device is to be used is of pure, or nearly pure, copper. Conductor wire 38 is a standard item and has a diameter within a standard range of variation, and crimp pocket 28 is dimensioned for slidably receiving the wire for ease in assembling the elements. After the wire is thus inserted, the crimped pocket is crimped, preferably at four places forming indents 40 spaced circumferentiall therearound. The on the inner surface of the crimp pocket or barrel which penetrated into the body of the conductor wire.

EXAMPLE V

Figure 16:
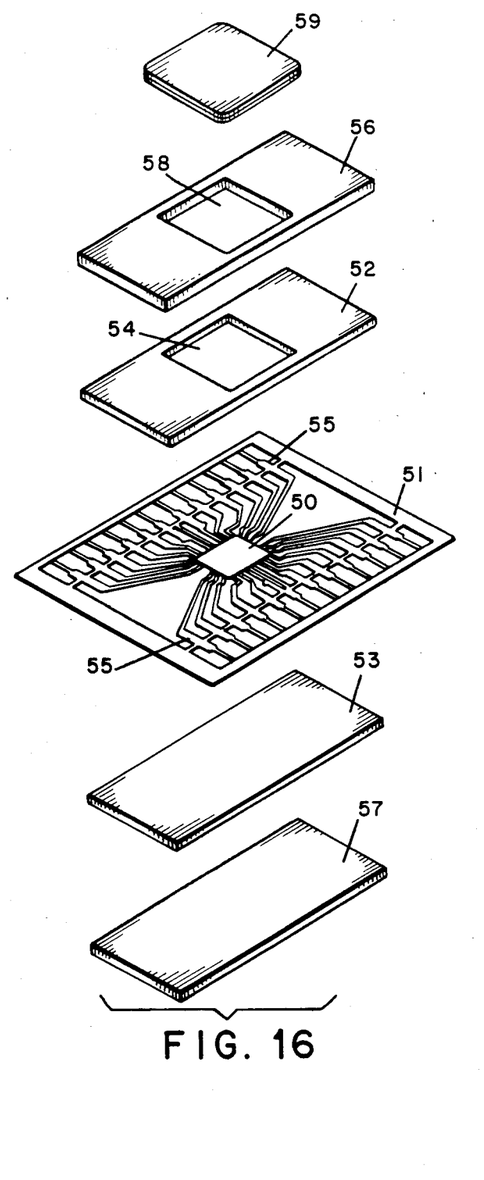
FIG. 16 is a perspective exploded view of a preferred hermetically sealed semiconductor device incorporating the improvement of this invention.

The improvement of this invention may be incorporated into hermetically sealed containers for semiconductors and other electronic devices of the type described and claimed in U.S. Pat. No. 4,109,861. Referring now to FIG. 16 of the drawings, there is shown in exploded perspective view an hermetically sealed container for electronic devices embodying the invention. This container comprises a supporting pad 50 for an electronic device and a conductive lead frame 51 of conventional construction surrounding the pad and forming therewith a unitary construction. Layers of thermosetting plastic material 52 and 53 extend over and are fused to either side of the lead frame 51 and its conductive leads. The layers 52 and 53 are preferably of homogeneous epoxy resin in sheet, paste, or liquid form, in the latter case being partially thermoset to adhere to the frame 51. The term homogeneous is used herein and in the appended claims in its usual sense to refer to a material uniform in composition and structure thruout its mass, as a solution or a crystal (CHEMICAL & ENGINEERING DICTIONARY, Chemical Publishing Company, Inc., New York, N.Y.) to distinguish from materials consisting of a mixture of particles of two or more substances. The plastic layer 52 in sheet form has an aperture 54 dimensioned and disposed to surround the supporting pad 50 and a portion of the leads 55 of the lead frame 51. The container also includes upper and lower cover plates 56 and 57 respectively, of a material impervious to moisture and air fused to the plastic sheets 52 and 53, respectively. The cover plates are preferably of a material of the group comprising metal, ceramic, glass, and rigid plastic. The cover plate 56 adjacent the plastic sheet 52 has an aperture 58 in registry with the aperture 54 of the sheet 52 for receiving an electronic device to be supported on the pad 10.

The container of FIG. 16 also includes means for hermetically sealing the opening 58 in cover plate 56 with a cover element plated with a nickel/indium/other metal alloy of this invention or a laminate of the said alloy and a material composed preponderantly of a precious metal such as gold or a gold alloy. This may be a combined cover plate solder-preformed unit 59.

What is claimed is:

1. An alloy consisting essentially of:
   (a) from aobut 0.1 to about 99% by weight nickel;
   (b) from about 0.1 to about 75% by weight indium; and
   (c) from about 0.1 to aobut 20% by weight of one or more other metal selected from the group consisting of copper, lead, ruthenium, rhenium, tin, iridium, antimony, zinc, bismuth, rhodium, arsenic, osmium, cadmium and germanium.

2. An alloy according to claim 1 wherein the amount of nickel is from about 99 to about 55% by weight.

3. An alloy according to claim 1 wherein the amount of indium is from about 0.1 to about 50% by weight.

4. An alloy according to claim 3 wherein the amount of indium is from about 0.1 to about 30% by weight.

5. An alloy according to claim 1 wherein the amount of said other metal is from about 0.1 to about 10% by weight.

6. An alloy according to claim 5 wherein the amount of said other metal is from about 0.5 to about 5% by weight.

7. An alloy according to claim 1 wherein said other metal is selected from the group consisting of lead, ruthenium, rhodium, rhenium, tin, urridium, antimony, zinc, bismuth, cadmium, osmium and arsenic.

8. An alloy according to claim 7 wherein said other metal is selected from the group consisting of ruthenium, rhodium, tin, antimony, bismuth, cadmium and arsenic.

9. An alloy according to claim 8 wherein said other metal is selected from the group consisting of tin, antimony, bismuth, and cadmium.

10. An alloy according to claim 7 wherein said other metal is bismuth.

11. A novel alloy consisting of:
(a) from about 0.1 to about 99% by weight nickel;
(b) from about 0.1 to about 75% by weight indium; and
(c) from about 0.1 to about 20% by weight of one or more metals selected from the group consisting of copper, lead, ruthenium, rhenium, tin, iridium, antimony, zinc, bismuth, rhodium, arsenic, osmium, cadmium, and germanium.

12. An alloy consisting essentially of:
(a) from about 80 to about 99% by weight nickel;
(b) from about 0.1 to about 19.9% by weight indium; and
(c) from about 0.1 to about 19.9% by weight of one or more other metal selected from the group consisting of copper, lead, ruthenium, rhenium, tin, iridium, antimony, zinc, bismuth, rhodium, arsenic, osmium, cadmium and germanium.

13. An alloy consisting essentially of:
(a) from about 90 to about 97% by weight nickel;
(b) from about 0.1 to about 9.9% by weight indium; and
(c) from about 0.1 to about 9.9% by weight of one or more other metal selected from the group consisting of copper, lead, ruthenium, rhenium, tin, iridium, antimony, zinc, bismuth, rhodium, arsenic, osmium, cadmium and germanium.

14. An alloy consisting essentially of:
(a) from about 0.1 to about 97.9% by weight nickel;
(b) from about 2 to about 10% by weight indium; and
(c) from about 0.1 to about 20% by weight of one or more other metal selected from the group consisting of copper, lead, ruthenium, rhenium, tin, iridium, antimony, zinc, bismuth, rhodium, arsenic, osmium, cadmium and germanium.

15. An improved electrical device of the type having electrical contact areas for providing electrical connection between said device and other electrical device the improvement comprises electrical contact areas electroplated with an alloy consisting essentially of from about 0.1 to 99 weight percent nickel, from about 0.1 to about 75 weight percent indium and about 0.1 to about 20 weight percent of one or more other metal selected from the group consisting of zinc, copper, gold, lead, silver, rhodium, germanium, ruthenium, rhenium, platinum, palladium, tin, iridium, antimony, gallium, bismuth, cadmium, osmium and arsenic.

16. A device according to claim 15 wherein the amount of nickel is from about 99 to about 55% by weight.

17. An device according to claim 16 wherein the amount of nickel is from about 99 to about 80% by weight.

18. An device according to claim 17 wherein the amount of nickel is from about 99 to about 90% by weight.

19. An device according to claim 18 wherein the amount of indium is from about 0.1 to about 50% by weight.

20. An device according to claim 19 wherein the amount of indium from about 0.1 to about 30% by weight.

21. An device according to claim 20 wherein the amount of indium is from about 2 to about 10% by weight.

22. An device according to claim 15 wherein the amount of said other metal is from about 0.1 to about 10% by weight.

23. An device according to claim 22 wherein the amount of said other metal is from abut 0.5 to about 5% by weight.

24. An device according to claim 15 wherein said other metal is selected from the group consisting of ruthenium, silver, rhodium, palladium, tin, antimony, bismuth, gallium, cadmium and arsenic.

25. An device according to claim 24 wherein said other metal is selected from the group consisting silver, tin, antimony, bismuth, gallium, and cadmium.

26. An device according to claim 25 wherein said other metal is bismuth.

27. An improved electrical device according to claim 15 having electrical contact areas, said device of the type having one or more insulating portions and one or more electrically conductive portions, said contact areas in electrical connection with one or more of said conductive portions and adapted to engage and form mating surfaces with one or more electrical contact areas of one or more other electrical devices to provide electrical connection between said one or more conductive portions of said device and said other devices, said alloy consisting essentially of from about 0.1 to 99 weight percent nickel, from 0.1 to about 75 weight percent indium and about 0.1 to about 20 weight percent of one or more other metals selected from the group consisting of zinc, copper, gold, lead, silver, rhodium, germanium, ruthenium, rhenium, platinum, palladium, tin, iridium, antimony, gallium, bismuth, cadmium, osmium and arsenic.

28. In an improved hermetic sealing cover for hermetically sealing a container for one or more electronic devices, said improvement comprising a cover plated with a nickel based alloy which consisting essentially of from about 0.1 to about 99 weight percent nickel, from about 0.1 to about 75 weight percent indium and from about 0.1 to about 20 weight percent of one or more other metals selected from the group consisting of zinc, copper, gold, lead, silver, rhodium, germanium, ruthenium, rhenium, platinum, palladium, tin, iridium, antimony, gallium, bismuth, cadmium, osmium, and arsenic.

29. A cover according to claim 28 which comprises:
a conductive cover element plated with said nickel based alloy the amount of said other metal in said nickel based alloy being less than about 10 weight percent; and
a performed ring of heat-fusible conductive material disposed in registry with the periphery of said cover element and fused thereto at a plurality of spaced points.

30. In an improved hermetically sealed container for electronic devices of the type comprising a body with a cavity having an opening, means for supporting one or more electronic devices, one or more electronic devices supported by said supporting means, and hermetic sealing means in hermetically sealing engagement with said opening, the improvement comprising hermetic sealing means which comprises a conductive cover element plated with a nickel based alloy disposed in registry with said opening and hermetically sealed thereto said alloy consisting essentially of from about 0.1 to about 99 weight percent nickel, from about 0.1 to about 75 weight percent indium and from about 0.1 to about 20 weight percent of one or more other metals selected from the group consisting of zinc, copper, gold, lead, silver, rhodium, germanium, ruthenium, rhenium, platinum, palladium, tin, iridium, antimony, gallium, bismuth, cadmium, osmium and arsenic.

31. A sealed container according to claim 30 comprising:
   a supporting pad for one or more electronic devices;
   one or more electronic devices positioned on said pad;
   a conductive lead frame surrounding said pad in electrical connection with said devices;
   a sheet of homogeneous plastic material extending over and fused to each face of said frame and its conductive leads, at least one of said sheets having an aperture dimensioned and disposed to surround said supporting pad and a portion of the adjacent leads of said lead frame;
   upper and lower cover plates of material impervious to moisture and air fused to said plastic sheets, one of said plates having an opening in registry with the aperture in the adjacent one of said plastic sheets for receiving an electronic device to be supported on said pad; and
   means for hermetically sealing said opening in said one of said plates comprising a conductive cover element plated with a nickel/indium alloy containing less than about 10 weight percent indium based on the total weight of the alloy.

32. A container according to claim 30 wherein said other metal is selected from the group consisting of ruthenium, rhodium, tin, antimony, bismuth, cadmium and arsenic.

33. A container according to claim 32 wherein said other metal is selected from the group consisting of tin, antimony, bismuth and cadmium.

* * * * *

UNITED STATES PATENT AND TRADEMARK OFFICE
CERTIFICATE OF CORRECTION

PATENT NO.    : 4,785,137
DATED         : November 15, 1988
INVENTOR(S)   : G.J. Samuels It is certified that error appears in the above-identified patent and that said Letters Patent is hereby corrected as shown below:

Col. 4, line 27:  "nikel" should read -- nickel --.
Col. 7, line 3:   At end of line, delete - N,N', --.
Col. 9, line 3:   Delete entire line.
Col. 13, line 36: "board" should read -- board 10.--.
Col. 14, line 31: At beginning of line, delete - photoresist --.
Col. 15, line 1:  "Boardsp" should read -- Boards --.
         line 63: "percentindium" should read
                  -- percent indium --.
Col. 17, line 56: "circumferentiall" should read
                  -- circumferentially --.

Col. 20, line 27: "from 0.1" should read -- from about 0.1 --.

Signed and Sealed this

Tenth Day of October, 1989

Attest:

DONALD J. QUIGG

Attesting Officer

Commissioner of Patents and Trademarks